United States Patent [19]

Dautriche

[11] Patent Number: 4,831,336

[45] Date of Patent: May 16, 1989

[54] ZERO TO ONE HUNDRED AND EIGHT-DEGREE ACTIVE PHASE SHIFTER FOR MICROWAVE FREQUENCIES

[75] Inventor: Pierre B. Dautriche, Chennevieres, France

[73] Assignee: U.S. Philips Corporation, New York, N.Y.

[21] Appl. No.: 145,860

[22] Filed: Jan. 20, 1988

[30] Foreign Application Priority Data

Jan. 20, 1987 [FR] France .................................. 87 00567

[51] Int. Cl.$^4$ ................................................ H03F 3/45
[52] U.S. Cl. ...................................... 330/253; 330/255
[58] Field of Search ................ 330/252, 253, 255, 294

[56] References Cited

U.S. PATENT DOCUMENTS 4,667,165  5/1987  De Weck .......................... 330/255

Primary Examiner—Gene Wan
Attorney, Agent, or Firm—Gregory P. Gadson

[57] ABSTRACT

A zero to one hundred and eight-degree active phase shifter for microwave frequencies contains a differential input amplifier having an inverting output ($\beta V$) and a non-inverting output ($\alpha V$) and a first ($T_{11}$, $T_{12}$) and a second ($T_{13}$, $T_{14}$) output stage of the push-pull type realized with MES-transistors and each comprising an inverting input and a non-inverting input. The inverting output ($\beta V$) of the input amplifier controls the inverting input ($T_{12}$) of the first output stage and the non-inverting input ($T_{13}$) of the second output stage. The non-inverting output ($\alpha V$) of the input amplifier controls the non-inverting input ($T_{11}$) of the first output stage and the inverting input ($T_{14}$) of the second output stage.

4 Claims, 2 Drawing Sheets

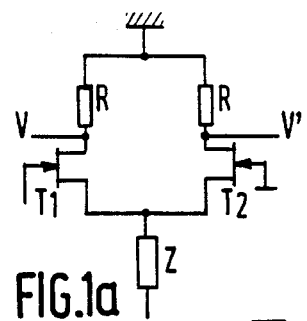
FIG.1a
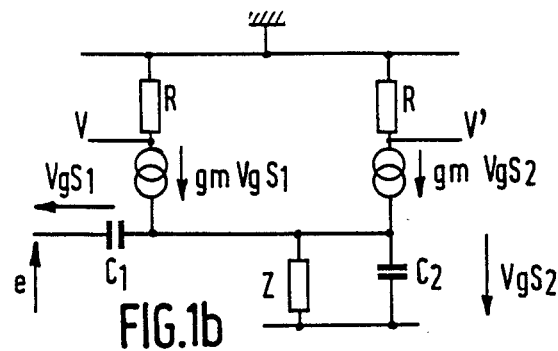
FIG.1b
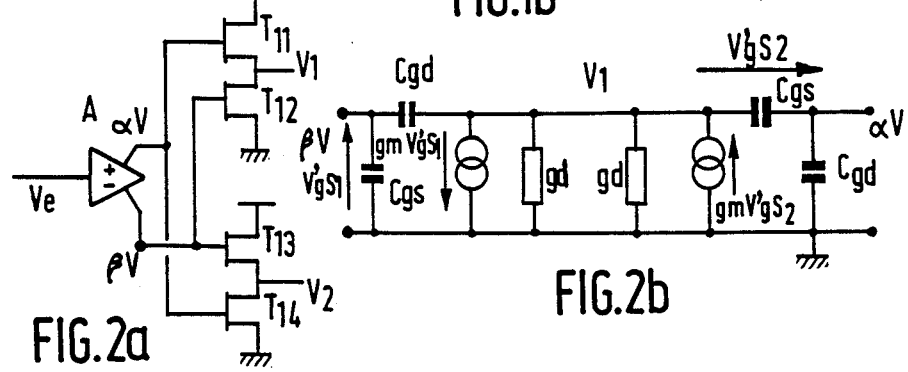
FIG.2a
FIG.2b
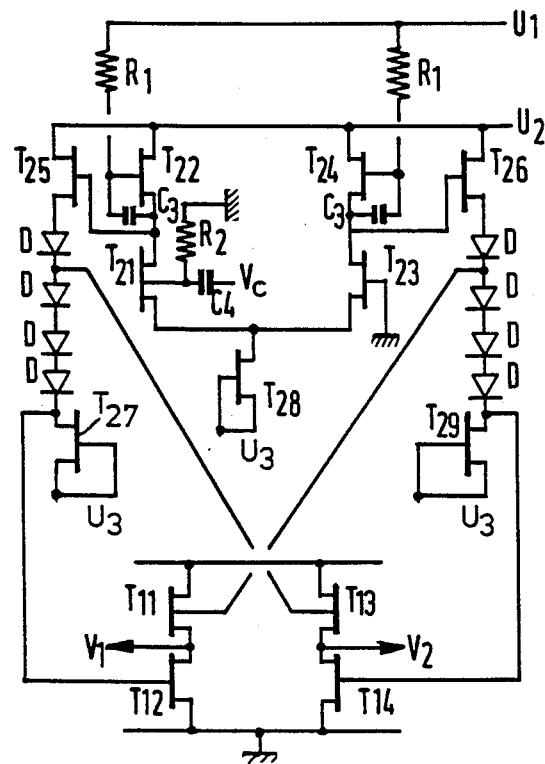
FIG.3

ZERO TO ONE HUNDRED AND EIGHT-DEGREE ACTIVE PHASE SHIFTER FOR MICROWAVE FREQUENCIES

BACKGROUND OF THE INVENTION

The invention relates to a 0°–180° active phase shifter for microwave frequencies.

A known phase shifter of this type embodies a differential shape comprising two field effect transistors whose sources are coupled together and which are charged by an impedance Z whose value is adjusted to obtain equality in the magnitude of the signals present at the drains of the transistors, and to obtain the desired value of the phase, i.e. 180°.

Such an adjustment can only be realized in a relatively small frequency band and, moreover, it occupies a considerable part of the surface of the substrate when it is integrated.

SUMMARY OF THE INVENTION

The invention has for its object to provide an active phase shifter embodying active elements but requiring a much less considerable part of the substrate surface, and which is also capable of functioning in a large frequency band and has inter alia a good common mode rejection.

To this end a 0°–180° active phase shifter for microwave frequencies according to the invention is characterized in that it comprises a differential input amplifier receiving an input signal and having an inverting output and a non-inverting output, and a first and a second output stage of the push-pull type realized with MESFET transistors, each stage comprising an inverting input and a non-inverting input, said inverting output controlling the inverting input of the first output stage and the non-inverting input of the second output stage and said non-inverting output controlling the non-inverting input of the first output stage and the inverting input of the second output stage, the outputs of the two output stages constituting the outputs of the phase shifter.

In a preferred embodiment the differential input amplifier is a MESFET amplifier having an active charge whose outputs control the respective inputs of the first and the second output stage and in that it comprises diodes arranged in series with the outputs of the said MESFET amplifier, whilst at least a certain number of the inputs of the first and the second output stage are connected to the said outputs of the MESFET amplifier via at least one of said diodes so as to compensate for level shifts.

BRIEF DESCRIPTION OF THE DRAWINGS

The invention will now be described in greater detail by way of example with reference to the accompanying drawings in which FIGS. 1a and 1b show a prior art differential stage phase shifter and its simplified circuit diagram, respectively.

FIGS. 2a and 2b show a circuit diagram of a phase shifter according to the invention and a simplified circuit diagram of one of its output stages, FIG. 3 shows a preferred embodiment of the phase shifter according to the invention.

DETAILED DESCRIPTION OF THE INVENTION

Figure 4A:
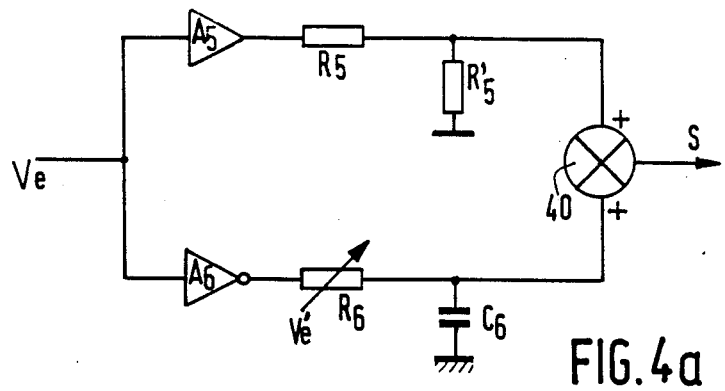
FIGS. 4a and 4b show a preferred embodiment of a variable phase shifter according to the invention.

FIG. 1a shows a prior art 0°–180° phase shifter having two source coupled MESFET transistors $T_1$ and $T_2$ so as to form a differential stage, an impedance Z being arranged between the sources and a power supply terminal. The drains of the transistors are connected to a common mode terminal via a resistor R. A simplified form of this circuit is shown in FIG. 1b. In this circuit the transistor $T_1$ is equivalent to a capacitor $C_1$ receiving the input voltage e at one of its terminals and supplying the voltage $VgS_1$ at its terminals, and it is equivalent to a controlled current source having a current gm $VgS_1$ arraged in series with the resistor R of the drain of the transistor $T_1$ and connected to the other terminal of the capacitor $C_1$. The transistor $T_2$ is equivalent to a capacitor $C_2$ arranged in parallel with the charge Z and supplying the voltage $VgS_2$ at its terminals, and it is equivalent to a controlled current source having a current $gmVgS_2$ arranged in series between the resistor R of the drain of the transistor $T_2$ and the parallel network Z, $C_2$.

Consequently:

$$VgShd\ 2 = VgS_1 - 3$$

$$gmV_{GS2} + gmV_{GS1} + jC\omega V_{GS1} + ((1/Z) + JC_2\omega) V_{GS2} = O$$

$$V' = -R\ gm\ VgS_2$$

$$V = -R\ gm\ VgS_1$$

The solution of the set of equations gives the values of V' and V:

$$V' = Rgm\ \frac{gm + jC_1\omega}{\frac{1}{Z} + 2gm + j(C_1 + C_2)\omega}\ e$$

$$V = -Rgm\ \frac{gm + \frac{1}{Z} + jC_2\omega}{\frac{1}{Z} + 2gm + j(C_1 + C_2)\omega}\ e$$

The equality of the modules (identical gains at the two branches) and the 180° phase shift can be obtained by adjusting the impedance Z. Such an adjustment can only be carried out for a limited frequency band the presence of passive elements involves a detrimental loss of space.

According to FIG. 2a a phase shifter according to the invention comprises a differential amplifier receiving an input signal Ve and producing a signal Va at its non-inverting output and a signal Vb at its inverting output.

Consequently:

$$Va = \alpha V = \frac{Gd + Gc}{2}\ e$$

$$Vb = \beta V = \frac{-Gd + Gc}{2}\ e$$

in which Gd denotes the gain of the differential amplifier and Gc denotes its common mode gain.

The output signals $V_1$ and $V_2$ of the phase shifter are produced by two push-pull amplifiers provided with MESFET transistors, the first amplifier comprising the transistors $T_{11}$ and $T_{12}$ receiving the signals $\alpha V$ and $\beta V$, respectively, at their gates, and the second amplifier comprising transistors $T_{13}$ and $T_{14}$ receiving the signals $\beta V$ and $\alpha V$, respectively, at their gates. The drain of transistor $T_{11}$ is connected to a power supply terminal, its source is connected to the drain of transistor $T_{12}$ and the source of transistor $T_{12}$ is connected to the common mode terminal. The drain of transistor $T_{13}$ is connected to the said power supply terminal, its source is connected to the drain of transistor $T_{14}$ and the source of transistor $T_{14}$ is connected to the common mode terminal. If the push-pull amplifiers are considered as being ideal, we have: $V_1 32 (\alpha - \beta) V = G d V_1$ and $V_2 = (\beta - \alpha) V = -G d V_1$, which corresponds exactly to the value of the module and the phase and to a total rejection of the common mode. In practice, the amplifiers introduce faults and the importance of the use of MESFET push-pull stages in the relevant case will now be explained.

A simplified equivalent circuit diagram of a push-pull stage constituted by the transistors $T_{11}$ and $T_{12}$ is shown in FIG. 2b. For the transistor $T_{11}$ receiving the signal $\alpha V$ the diagram shows a parallel capacitor having a value Cgd receiving the voltage $\alpha V$ at its terminals, a series capacitor having the value Cgs one terminal of which is connected to the ungrounded terminal of the parallel capacitor Cgd and the other terminal of which is connected to a terminal of a controlled current source having current $gmV'gs_2$ connected via the common mode terminal, in which $V'gs_2$ denotes the voltage at the terminals of the capacitor Cgs. A conductance having a value gd is connected parallel to the above-mentioned current source. For the transistor $T_{12}$ receiving the signal $\beta V$ the circuit diagram shows a parallel capacitor having a value Cgs receiving the voltage $\beta V$ (by definition equal to $V'gs_1$) at its terminals, a series capacitor having a value Cgd one terminal of which is connected to the ungrounded terminal of the parallel capacitor Cgs and the other terminal of which is connected to a terminal of a controlled current source having a current $gm V'gs_1$ connected via the common mode terminal. Finally a conductance of the value gd is connected parallel to the above-mentioned current source.

The output voltage $V_1$ is the voltage which is present at the common terminal of the series capacitors and the conductances of the value gd.

We have:

$V'gs_1 = \beta V$
$V'gs_2 = \alpha V - V_1 - gmV'gs_1 + gmV'gs_2 - gV + (\beta V - V_1) j\omega Cgd + (\alpha V - V_1) j\omega Cgs = 0$
with $g = 2gd$.

Thus, $$V_1 = \frac{gm(\alpha - \beta)}{G} V + j\omega \frac{(Cgd\beta + Cgs\alpha)}{G} V$$

with
$gm + g + j\omega(Cgs + Cgd) = G$

For obtaining the value of $V_2$ it is sufficient to invert $\alpha$ and $\beta$ in the preceding formula.
Thus, $$V_2 = -\frac{gm(\alpha - \beta)}{G} V + j\omega \frac{(Cgd\alpha + Cgs\beta)}{G} V$$

By replacing $\alpha$ and $\beta$ by their value:

$$\alpha = \frac{Gc + Gd}{2} \quad \beta = \frac{-Gd + Gc}{2},$$

we have:

$$V_1 = \frac{gm}{G} GdV + \frac{j\omega}{2G} Gc(Cgd + Cgs)V + \frac{j\omega}{2G} Gd(Cgs'Cgd)V$$

$$V_2 = -\frac{gm}{G} GdV + \frac{j\omega}{2G} Gc(Cgd + Cgs)V +$$

$$\frac{j\omega}{2G} Gd(Cgs - Cgs)V$$

that is to say:

$$V_1 = \left[ gm + \frac{j\omega}{2} (Cgs - Cgd) \right] \frac{GdV}{G} +$$

$$\frac{j\omega}{2G} Gc(Ggd + Cgs)V$$

$$V_2 = -\left[ gm + \frac{j\omega}{2} (Cgs - Cgd) \right] \frac{GdV}{G} +$$

$$\frac{j\omega}{2G} Gc(Gdg + Cgs)V$$

A reduction in the common mode gain is obtained because of a multiplicative factor k which is less than 1:

$$k = \frac{j\omega(Cgd + Cgs)}{G}$$

As far as the phase shift if concerned, its value is exact from $f=O$ and it progressively degrades at high frequencies. It can be shown that the improvement can be expressed in the equivalent form of the factor K:

$$K = \frac{1}{\sqrt{1 + \left(\frac{ft}{f}\right)^2}}$$

with $ft = \frac{gm}{2\pi Cgs}$

Thus an improvement is obtained relating to the phase up to the cut-off frequency of the transistor.

In FIG. 3 the phase shifter comprises an differential input stage having two MESFET transistors whose sources are coupled and connected to a current source constituted by a transistor $T_{28}$, whose gate and source are connected to the negative power supply terminal $U_3$ (for example, $-4$ V) and whose drain is connected to the sources of the transistors $T_{21}$ and $T_{23}$. The input voltage Ve is applied to the gate of transistor $T_{21}$ via a decoupling network comprising a series capacitor $C_4$ and a parallel resistor $R_2$ between the gate of transistor $T_{21}$ and the common mode terminal. The gate of transistor $T_{23}$ is directly coupled to the common mode terminal.

In order to obtain a dynamic gain while preserving a continuous gain of the order of one, the drains of the transistors $T_{21}$ and $T_{23}$ are associated with an active charge constituted by MESFET transistors $T_{22}$ and $T_{24}$ whose sources are connected to the drain of the corresponding transistor and which comprise a capacitor $C_3$ of low value (of the order of a picofarad) connected between their source and their gate. The gate of each transistor $T_{22}$ and $T_{24}$ is connected to a power supply terminal $U_1$ (of, for example, +1.5 V) via a resistor $R_1$ and their drain is connected to a power supply terminal $U_2$ (for example, +4V).

Transistors $T_{25}$ and $T_{26}$ arranged as followers whose drain is directly connected to the supply source $U_2$ receive the drain voltages of the transistors $T_{21}$ and $T_{23}$, respectively, at their gate. The sources of transistors $T_{25}$ and $T_{26}$ are each connected to a group of several series-arranged diodes D, in this example 4, so as to realize a level adaptation for the push-pull output stages. Transistors $T_{27}$ and $T_{29}$ arranged as a current source in a manner analogous to transistor $T_{28}$ have their drain connected to the cathode of the last diode of each group so as to define the current flowing through the diodes and thus the voltage drop in these diodes.

The source of the transistors $T_{25}$ and $T_{26}$ is connected to the gate of the transistors $T_{13}$ and $T_{11}$, respectively, with a voltage drop in one diode, and to the gate of the transistors $T_{12}$ and $T_{14}$, respectively, with a voltage drop in the total number of diodes, namely 4, which permits of correctly polarizing the output stages. In this configuration $U_1 = 1.5$ V, $U_2 = 6$ V and $U_3 = -4$ V.

Figure 4B:
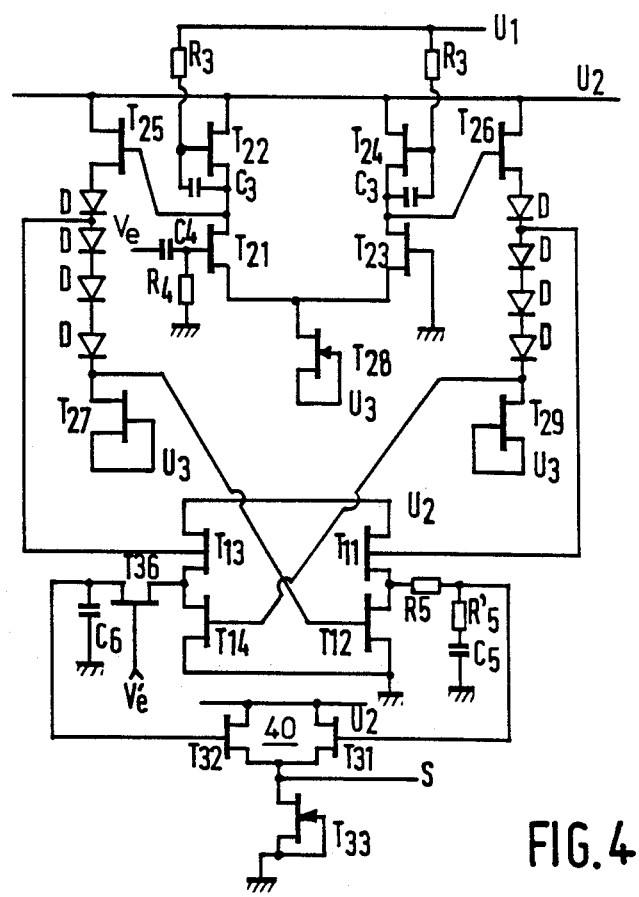

FIGS. 4a and 4b show a preferred embodiment of the invention in which the value of the phase difference between the outputs of the phase shifter can vary between 0° and 180°.

In FIG. 4a a phase shift circuit ($\phi_1$, $\phi_2$) comprises two parallel branches receiving the input signal. The first parallel branch comprises an amplifier $A_5$ whose output is charged by two identical series-arranged resistors $R_5$ and $R'_5$, $R'_5$ having a terminal connected to the common mode terminal. The common terminal of the resistors $R_5$ and $R'_5$ constitutes the output of the first branch. The second parallel branch comprises an inverter amplifier $A_6$ whose output is charged by a variable resistor $R_6$ whose value is controlled by a voltge $V'e$ and a capacitor $C_6$ having a terminal connected to the common mode terminal. The common terminal of the resistor $R_6$ and the capacitor $C_6$ constitutes the output of the second branch.

The outputs of the two branches are combined by a summation circuit 40 whose output provides a signal S.

With $R_5 = R'_5$ and the two amplifiers $A_5$ and $A_6$ having the same gain A we have:

$$S = \frac{AVe}{2} - \frac{AVe}{JC_6\omega} \cdot \frac{1}{R_6 + \frac{1}{JC_6\omega}}$$

or $$S = \frac{-AVe}{2} \cdot \frac{1 - \tau p}{1 + \tau p}$$

The phase shift for a given frequency depends on the time constant $\tau = R_6 C_6$.
We have:

$$\left|\frac{S}{e}\right| = \frac{A}{2}; \Delta\phi = 180° = 2 \, Arc \, tg \, p\tau$$

Thus, a phase difference $\Delta\phi$ can be written which varies between 0° and 180° in accordance with the value of $\tau$, thus of $R_6$.

FIG. 4b shows a particularly advantageous embodiment of the phase shifter in which the phase difference may be controlled between 0° and 180° and which embodies a MESFET differential input stage having an active charge and an output stage for each amplifier comprising the MESFET transistors arranged in a push-pull configuration which permits of optimising the residual common mode voltage.

An improvement relating to the phase up to the cut-off frequency of the transistor is thus obtained.

Similar elements in FIG. 4b have the same reference numerals as in FIG. 3.

The resistors $R_5$ and $R'_5$ are arranged in series between the output of the push-pull stage $T_{11}$, $T_{12}$ and the common mode terminal with the possible interpositioning of a decoupling capacitor $C_5$ having a low value. The variable resistor $R_6$ is the drain-source resistor of a MESFET transistor $T_{36}$ whose drain is connected to the output of the push-pull stage $T_{13}$, $T_{14}$ and whose source is connected to the ungrounded terminal of the capacitor $C_6$. The gate of transistor $T_{36}$ receives a voltage $V'e$.

Finally, the summation circuit 40 is constituted by two MESFET transistors $T_{31}$ and $T_{32}$ whose drains are connected to the power supply source $U_2$, whose sources are interconnected and connected to a transistor $T_{33}$ arranged as a current source in a manner analogous to transistor $T_{28}$. The source of transistor $T_{36}$ is connected to the gate of transistor $T_{32}$ and the common terminal of the resistors $R_5$ and $R'_5$ is connected to the gate of transistor $T_{31}$ which produces the sum of their voltages at the sources of the transistors $T_{31}$ and $T_{32}$ (signal S). To vary the phase difference between 0° and 180°, the voltage $V'e$ must be varied up to the pinch-off voltage of the channel of the transistor $T_{36}$.

What is claimed is:

1. A 0°-180° active phase shifter for microwave frequencies, characterized in that it comprises a differential input amplifier receiving an input signal and having an inverting output and a non-inverting output, and a first and a second output stage of the push-pull type realized with MESFET transistors, each stage comprising an inverting input and a non-inverting input, said inverting output controlling the inverting input of the first output stage and the non-inverting input of the second output stage and said non-inverting output controlling the non-inverting input of the first output stage and the inverting input of the second output stage, the outputs of the two output stages constituting the outputs of the phase shifter.

2. A phase shifter as claimed in claim 1, characterized in that the differential input amplifier is a MESFET amplifier having an active charge whose outputs control the respective inputs of the first and the second output stage and in that it comprises diodes arranged in series with the outputs of the said MESFET amplifier, whilst at least a certain number of the inputs of the first and the second output stage are connected to the said outputs of the MESFET amplifier via at least one of said diodes so as to compensate for level shifts.

3. A phase shifter as claimed in claim 1, characterized in that the output of the first output stage is charged by the drain-source path of a first transistor whose gate receives a control signal, in series with a capacitor, the output of the second output stage being charged by a first and a second resistor arranged in series, and in that the voltages present at the common terminal of the drain-source path of the first transistor and the capacitor on the one hand and at the common terminal of the first and the second resistor on the other hand are combined by a summation circuit whose output supplies a signal whose phase varies as a function of the control signal.

4. A phase shifter as claimed in claim 2, characterized in that the output of the first output stage is charged by the drain-source path of a first transistor whose gate receives a control signal, in series with a capacitor, the output of the second output stage being charged by a first and a second resistor arranged in series, and in that the voltages present at the common terminal of the drain-source path of the first transistor and the capacitor on the one hand and at the common terminal of the first and the second resistor on the other hand are combined by a summation circuit whose output supplies a signal whose phase varies as a function of the control signal.

* * * * *